(12) United States Patent
Scott et al.

(10) Patent No.: US 11,415,634 B2
(45) Date of Patent: Aug. 16, 2022

(54) BATTERY PERFORMANCE ASSESSMENT METHOD AND APPARATUS

(71) Applicant: Waikatolink Limited, Hamilton (NZ)

(72) Inventors: Jonathan Brereton Scott, Hamilton (NZ); Peter Scott Vallack Single, Sydney (AU); Rahat Hasan, Hamilton (NZ)

(73) Assignee: Waikatolink Limited, Hamilton (NZ)

( * ) Notice: Subject to any disclaimer, the term of this patent is extended or adjusted under 35 U.S.C. 154(b) by 128 days.

(21) Appl. No.: 15/930,989

(22) Filed: May 13, 2020

(65) Prior Publication Data

US 2020/0371164 A1 Nov. 26, 2020

(30) Foreign Application Priority Data

May 20, 2019 (NZ) ...................................... 753706

(51) Int. Cl.
*G01R 31/385* (2019.01)
*G01R 31/364* (2019.01)
(Continued)

(52) U.S. Cl.
CPC ......... *G01R 31/386* (2019.01); *G01R 31/364* (2019.01); *G01R 31/389* (2019.01); *G01R 31/392* (2019.01)

(58) Field of Classification Search
CPC .. G01R 31/386; G01R 31/364; G01R 31/389; G01R 31/392; G01R 31/367; G01R 31/3842
See application file for complete search history.

(56) References Cited

U.S. PATENT DOCUMENTS

| 7,616,003 B2 | 11/2009 | Satoh et al. |
| 9,531,040 B2 | 12/2016 | Osaka et al. |
| (Continued) | | |

FOREIGN PATENT DOCUMENTS

CN 102809691 A * 12/2012 ........... G01R 31/396

OTHER PUBLICATIONS

Freeborn et al., Fractional-order models of supercapacitors, batteries and fuel cells: a survey, Mater Renew Sustain Energy (2015) 4:9 (Year: 2015).*

(Continued)

*Primary Examiner* — Daniel R Miller
(74) *Attorney, Agent, or Firm* — Studebaker & Brackett PC

(57) ABSTRACT

In one aspect the invention provides an assessment apparatus which includes two terminal connectors configured to electrically connect the assessment apparatus to the positive and negative terminals of a battery being assessed. The apparatus also includes a response measurement system configured to measure the terminal voltage and current of the battery when supplied with at least one alternating test current having a frequency less than 1 Hz and/or less than an impedance transition frequency associated with the battery being assessed. Also provided is a processor in communication with the response measurement system and being configured to output a performance assessment indicator for the battery being assessed by calculating at least one impedance for the battery using terminal voltage and current measurements communicated by the response measurement system.

19 Claims, 12 Drawing Sheets

(51) Int. Cl.
    *G01R 31/392*     (2019.01)
    *G01R 31/389*     (2019.01)

(56) References Cited

U.S. PATENT DOCUMENTS

| | | |
|---|---|---|
| 2012/0019253 A1 | 1/2012 | Ziegler et al. |
| 2014/0103934 A1 | 4/2014 | Matsui et al. |
| 2017/0254859 A1* | 9/2017 | Christophersen .... G01R 31/392 |
| 2018/0321326 A1 | 11/2018 | Tanaka et al. |
| 2019/0094307 A1 | 3/2019 | Brebant et al. |
| 2019/0195960 A1* | 6/2019 | Koba ................. G01R 31/3648 |

OTHER PUBLICATIONS

Hasan et al., Fractional Behaviour of Rechargeable Batteries, ENZCon 2016, 2016 (Year: 2016).*

Ma et al., Fractional Modeling and SOC Estimation of Lithium-ion Battery, IEEE/CAA Journal of Automatica Sinica, vol. 3, No. 3, Jul. 2016 (Year: 2016).*

International Search Report issued in PCT/NZ2020/050050; dated Aug. 3, 2020.

Written Opinion issued in PCT/NZ2020/050050; dated Aug. 3, 2020.

* cited by examiner

BATTERY PERFORMANCE ASSESSMENT METHOD AND APPARATUS

FIELD OF THE INVENTION

This invention relates to a battery performance and quality assessment method and apparatus. In preferred embodiments the invention may be used to provide a battery state of health assessment.

BACKGROUND OF THE INVENTION

It is increasingly common for electrical devices and systems to use power supplies which incorporate batteries. Batteries are used in a wide range of applications, from communications and entertainment electronics through to electric vehicles and satellite power systems.

Over time the performance of a battery will degrade as it completes a large number of charge and discharge cycles. The performance of the battery can also be impacted by exposure to excessive heat or cold, humid conditions or by being overcharged or severely discharged. In many applications it is important to know what the condition or state of health of a battery is to potentially forecast how long a battery can continue to operate at a desired level of performance.

For example, in the case of uninterruptible power supplies batteries are used to prevent the failure of computer systems disconnected from mains power electrical supplies. It is critical to ensure that the batteries used have a robust state of health to be able to service loads which could be placed upon them at any time.

The terminal voltage of the battery can be measured, and an assessment made of the amount of charge held by the battery. However, this measurement requires the battery to be disconnected from the load it normally services, and terminal voltage in isolation does not provide a useful picture of battery state of health.

For this reason, prior art battery performance assessment methods use testing procedures to investigate battery impedance, which provides a better indicator of the physical state of the battery cells and hence its state of health. For example, in some prior art assessment techniques it is a common practice to apply a 1 kHz stimulation signal to a battery to attempt to measure its impedance.

However again one or more battery impedance measurements recorded at the same time will not provide an effective indicator of battery state of health. Standard practice with current state-of-the-art health assessment methods is to record multiple battery impedance measurements over a long period of time in an attempt to identify a baseline impedance and to identify trends in the change of this baseline impedance.

Unfortunately, while results obtained from current state-of-the art assessment methods are reasonable, the accuracy of the actual assessment result itself is questionable. This is indicated by the failure of some batteries well prior to their predicted end dates.

It would therefore be of advantage to have an improved method and apparatus for assessing the performance of a battery (and possibly doing so with an increased sensitivity or accuracy) which addressed any or all the above issues, or at least that provided an alternative choice to the prior art. In particular it would be of advantage to have a technology available for assessing the performance and quality of the battery which did not require multiple independent measurements to be recorded at different times over an extended period of time, and/or which did not require the battery to be disconnected from the load normally serviced. Improvements over the prior art which provided more accurate performance assessments would also be of advantage.

DISCLOSURE OF THE INVENTION

According to one aspect of the present invention there is provided a battery performance assessment apparatus which includes two terminal connectors configured to electrically connect the assessment apparatus to the positive and negative terminals of a battery being assessed, and a response measurement system configured to measure the terminal voltage and current of the battery when supplied with at least one alternating test current having a frequency less than 1 Hz and/or less than an impedance transition frequency associated with the battery being assessed, and a processor in communication with the response measurement system and being configured to output a performance assessment indicator for the battery being assessed by calculating at least one impedance for the battery using terminal voltage and current measurements communicated by the response measurement system.

According to another aspect of the present invention there is provided a battery performance assessment apparatus which includes two terminal connectors configured to electrically connect the assessment apparatus to the positive and negative terminals of a battery being assessed, and a test current source configured to supply at least one alternating test current to the battery being assessed, said at least one alternating test current having a frequency less than 1 Hz and/or less than an impedance transition frequency associated with the battery being assessed, and a response measurement system configured to measure the terminal voltage and current of the battery when supplied with said at least one alternating test current, and a processor in communication with the response measurement system and being configured to output a performance assessment indicator for the battery being assessed by calculating at least one impedance for the battery using terminal voltage and current measurements communicated by the response measurement system.

According to a further aspect of the present invention there is provided a battery performance assessment apparatus substantially as described above wherein the processor is programmed to implement a circuit simulation model which uses the terminal voltage and current measurements communicated to the processor as input parameters to define at least one constant phase element fractional capacitor to simulate the battery being assessed.

According to another aspect of the present invention there is provided a battery performance assessment apparatus substantially as described above wherein the processor is programmed to implement a circuit simulation model which uses the terminal voltage and current measurements communicated to the processor as input parameters to define a plurality of fractionally arranged constant phase element fractional capacitor components to simulate the battery being assessed.

The present invention provides a battery performance assessment apparatus, in addition to a method of assessing the performance of a battery. Additional aspects of the invention encompass the provision of an improved circuit simulation model implemented through computer executable instructions run on a processor or similar programmable computer system utilised by the invention.

Reference in general throughout this specification will also be made to the invention being used primarily to assess the performance of a battery. Those skilled in the art will appreciate that references made to batteries throughout this specification encompasses both the assessment of the performance of a single electrical cell, or an array of cells connected together. Those skilled in the art will therefore appreciate that references made to the invention working with a battery also encompasses the invention assessing the performance of a single electrical cell.

Furthermore, reference will also be made to the provision of a test current source which is used to supply one or more alternating test currents in association with the present invention. Those skilled in the art will appreciate that this test current source may be formed by dedicated stand-alone components in some embodiments, and/or where the normal electrical load or load is connected to the battery in other embodiments.

The assessment apparatus provided by the invention employs terminal connectors to engage at least a test current source and a response measurement system to a battery being assessed. Those skilled in the art will appreciate that any appropriate form of connector may be used to form terminal conductors which can allow electrical current flows to and from the battery and which allow for the measurement of various electrical parameters of the battery.

The assessment apparatus provided by the invention also incorporates a processor in communication with a response measurement system.

In some embodiments this processor may be physically connected to other elements of the apparatus, potentially being enclosed within a single common housing with these components.

In other embodiments the processor may be located remotely from the battery, test current source and response measurement system, and may be configured to receive information from, or transmit operational commands to various other components of the invention.

In yet other embodiments the processor may be implemented with a distributed architecture where a number of separate hardware components are connected together to form the processor, these components potentially being located remote from one another or from the battery being assessed.

Those skilled in the art will appreciate that well-known information technology systems may be used to implement this remote processor architecture, and furthermore the processor itself may be implemented across or by several separate microprocessors or integrated circuits.

Reference throughout this specification will however be made to a processor being implemented by a microprocessor or microcontroller physically connected to at least the response measurement system of the apparatus. Again those skilled in the art will appreciate that other circuit architectures are also envisioned and within the scope of the present invention.

The processor integrated into the assessment apparatus is configured to output a performance assessment indicator for a battery being assessed. Those skilled in the art will appreciate that the form, format or information incorporated within this indicator may vary over different embodiments of the invention. The specific performance criteria defined for a battery may differ depending on the application in which the battery is used—for example, performance may be assessed in some embodiments by the maximum current which can be supplied, or alternatively by the maximum charge storage capacity.

In one embodiment a performance assessment indicator may be provided by a simple Boolean yes—no, good—bad output, whereas in other embodiments this indicator may take the form of a percentage estimated lifespan time period or estimated number of charge/discharge cycles remaining before the battery is unable to meet a set performance criteria requirement. An indicator may also take the form of a measured or derived value for an electrical parameter of the battery, for example being battery fractional capacitance. In yet other embodiments an indicator may take the form of a percentage achieved for a target performance criteria, such as—for example—assessed battery fractional capacitance compared to a target fractional capacitance, or maximum current delivered compared to a target current value. An indicator or indicators may also take the form of a graphical representation, plot or graph making a comparison between performance assessments undertaken at different times.

Those skilled in the art will also appreciate that a performance assessment indicator may be determined using voltage and current measurements recorded during a single continuous measurement period in response to several different frequencies of test currents, or multiple measurements recorded at during different measurement periods, again in response to the same test current. Those skilled in the art will appreciate that a single measurement period may span a variable length of time depending on the number of and frequencies of test currents applied during this period. A performance assessment indicator may also be determined using voltage and current measurements recorded in response to the use of several different frequencies of test currents, be they applied at approximately the same or at different times.

Reference in general will be made throughout this specification to the performance indicator generated by the invention identifying the state of health of a battery. Those skilled in the art will however appreciate that other metrics for battery performance may also be assessed in other embodiments and may include an assessment of the quality of the battery being assessed.

In a variety of embodiments battery impedance may be calculated from voltage and current measurements recorded in response to the use of several different frequencies to test currents, and these impedance values can be used to calculate, or determine one or more performance assessment indicators.

For example in one particular embodiment a performance assessment indicator may be calculated using the rate of change of calculated impedance values with frequency. This rate of change of impedance values recorded using test currents below the impedance transition frequency or the less than 1 Hz can be used to indicate the efficiency of a battery, being the ratio of charging energy supply to the battery compared to stored energy available from the battery. A relatively high rate of change may be associated with a battery that has a higher efficiency than a battery with a lower rate of change value.

In another embodiment a performance assessment indicator may be calculated using the lower-frequency impedance values plotted with frequency coupled to the high-frequency impedance values. The values of impedance values recorded using test currents below the impedance transition frequency suggest a straight line. Where this straight line crosses the value measured at high frequencies is an estimate of the impedance transition frequency. A relatively high impedance transition frequency may indicate that a battery has a reduced ability to sustain high power energy delivery.

In yet another embodiment a performance assessment indicator may be calculated using at least one impedance zero offset value. These values can represent the magnitude of impedances recorded for a battery using test currents below the impedance transition frequency. In such embodiments a performance assessment indicator representative of the maximum charge capacity of the battery may be evaluated by, for example, extrapolating a y-axis intercept value for plotted impedance measurements against test current frequency, or alternatively comparing impedance values at a selected predetermined frequency value below the impedance transition frequency. A relatively low impedance zero offset value or values may indicate that at battery has a greater storage capacity than a battery associated with a higher zero offset value or values.

In yet another embodiment a performance assessment indicator may be calculated using a transition bandwidth value. This impedance transition frequency bandwidth value can be found by identifying the frequency range where a relatively constant rate of change of the impedance of the battery at low frequencies transitions to an alternative or different rate of change of impedance at higher frequencies. The bandwidth of this transition zone can in some embodiments provide a general indication of the quality of the manufacture of the battery being assessed, the precision or tolerances used in the components making of the battery and/or the purity of the compounds employed to form the battery. In such embodiments a better quality battery may exhibit a smaller transition bandwidth value than a lower quality battery.

Those skilled in the art will appreciate that in various embodiments performance indicators may also be derived from combinations of rates of impedance change, transition frequency values, zero offset values and transition bandwidth values. This information can be used as parameters to a range of models or calibrations developed for specific battery constructions and may provide performance indicators appropriate to a variety of different battery performance characteristics.

In a preferred embodiment a battery performance assessment apparatus may also include a temperature sensor which in use is placed in close proximity to the battery being assessed. In such embodiments this temperature sensor may provide a measurement of the battery temperature to the processor to improve the accuracy of calculations undertaken to assess the performance of the battery. This temperature information can also be used in combination with a calibration undertaken for the form or type of the battery being assessed to apply corrections to measurements undertaken by the response measurement system.

The assessment apparatus provided by the invention includes a response measurement system which is used to measure the terminal voltage and current of the battery being assessed. These measurements are made when the battery responds to a test current.

In a preferred embodiment the response measurement system may record a plurality of measurements of both terminal voltage and current over the time period when a particular test current is applied to the battery. Those skilled in the art will appreciate that a range of prior art voltage and current measurement technologies may be employed with a required accuracy, resolution and precision depending on the application in which the invention is employed.

In one embodiment, the assessment apparatus provided by the invention preferably includes a test current source configured to stimulate the battery being assessed with at least one alternating test current.

In other embodiments the application of at least one single cycle of the alternating test current ensures that the battery experiences both charging and discharging.

In yet another embodiment, the application of at least one single cycle of the alternating test current ensures that the battery experiences either charging or discharging depending on the 'at use' charging or discharging operation of the battery.

Those skilled in the art will appreciate that a test current source may be provided by a number of different arrangements of components in various embodiments.

In a preferred embodiment a test current source may be provided by a dedicated alternating current generation circuit. Existing technology in this field may be readily utilised to implement this form of component.

In an alternative embodiment a test current source may be formed by or incorporates switching electronics connected across two or more batteries. In such embodiments two or more of these batteries may have their state of health assessed concurrently, where current supplied from one battery can be used to charge the other battery and vice versa.

In yet other alternative embodiments the regular load and charging circuits normally connected to a battery during its usual application may be utilised as a test current source. Again these existing circuits can be connected to the battery using switching technology to charge and discharge the battery being assessed at the frequency required of an alternating test current.

In a preferred embodiment the processor incorporated within the assessment apparatus may be configured to control the operation of the test current source, and in particular the magnitude and frequency of the alternating test current applied to a battery. The processor may also control the time period over which a particular test current is applied. Furthermore, in various embodiments a processor may be configured to ensure that a plurality of alternating test currents with different frequencies are applied to the battery being assessed.

Reference throughout this specification will also be made to the processor being used to control the operation of the test current source and specifically being used to apply a number of alternating test currents with different frequencies. However those skilled in the art will appreciate that in other embodiments the processor integrated with the assessment apparatus need not necessarily function in this way. For example, in some alternative embodiments the test current source may include internal control systems configured to apply one or potentially a number of predetermined alternating test currents at selected frequencies.

In a preferred embodiment the assessment apparatus may undertake a test procedure which applies a plurality of alternating test currents with different frequencies. For example, in some embodiments the test current source may sequentially apply a set of alternating test currents one after the other while the response measurement system records battery terminal voltage and current. However, in one or more alternative embodiments a test current source may apply a composite test current signal. This composite test current can be formed from the summation of two or more separate alternating test currents at particular frequencies of interest in the operation of the invention.

In a preferred embodiment the assessment apparatus may apply a test current for at least one cycle or period of the frequency of the test current. Applying these currents for a full cycle allows measurements to be captured across the entire range of charging and discharging operations experienced by the battery. In additional embodiments test currents may also be applied over many cycles to allow detailed measurements to be captured and to potentially mitigate errors in such measurements. In yet other embodiments a full cycle of measurements related to a particular test current may be provided from the merger of two or more measurements undertaken at different times, but which together show the batteries response to the entire period of the test current waveform.

The assessment apparatus provided by the invention is used to apply alternating test currents that have frequencies less than 1 Hz or less than an impedance transition frequency associated with the battery being assessed.

This impedance transition frequency or frequencies can be determined experimentally for the form, construction or type of the battery being assessed. A plot can be made of measurements completed of battery impedance over a range of frequencies, preferably extending to below 1 µHz and up to at least 1-10 Hz. This impedance transition frequency zone can be found by identifying the frequency range where a relatively constant rate of change of the impedance of the battery at low frequencies transitions to an alternative or different rate of change of impedance at higher frequencies. By identifying the impedance transition frequency or frequencies of the battery the invention can then apply test currents with lower frequencies. These low frequency test currents are used by the invention to assess the performance of the battery.

In a preferred embodiment the magnitude of the peak or RMS current of the alternating test current may be varied based on the frequency of the alternating test current. In various embodiments an alternating test current may be applied for at least one cycle, which at low frequency values may result in relatively long charge and discharge times. The invention may therefore manage the magnitude of the alternating current applied to a battery during the assessment process to ensure that it is not overcharged or severely discharged and damaged during assessment. Furthermore, this approach also ensures that measurements are not made of a response to a test current when the battery has an extremely low or high state of charge.

In a preferred embodiment the magnitude or amplitude of an alternating test current may be set based on the frequency of the signal being applied and the capacity of the battery being assessed. For example in some embodiments the test current applied may only deliver or remove approximately 10 percent of the charge capacity of the battery. In yet other embodiments only 1 percent of the charge capacity of the battery may be delivered or removed by a test current.

In some embodiments the assessment apparatus may be configured to execute a preliminary charge state fixing process prior to applying an alternating test current to a battery. In such embodiments the apparatus may be configured to apply a charging current at a voltage which provides a predictable state of charge in the battery. Charge may be supplied to the battery to preferably charge it to approximately the mid-point of its capacity, thereby minimising the potential for the battery being overcharged or over-discharged by the application of an alternating test current.

Preferably the processor provided with the assessment apparatus may be used to calculate a plurality of impedance values for the battery, each of these impedances being associated with a particular frequency alternating test current. These impedance values can be used in some embodiments by the processor as input parameters to a circuit simulation model run by the processor which aims to model and predict the characteristics of the battery. However in other embodiments performance indicators may be determined using these impedance values without the use of a circuit simulation model, as discussed above.

In a preferred embodiment the processor may be used to implement a circuit simulation model which uses these impedance values to define at least one constant phase element fractional capacitor to simulate the characteristics of the battery. Those skilled in the art will also appreciate that this component can be described as a fractional capacitor or a constant phase element. In a further embodiment the circuit simulation model may define or model the battery using a single constant phase element fractional capacitor—also known as a 'CPE'—in combination with a single series resistance.

In such embodiments the parameters of the CPE component of this model may be defined using the rate of change of calculated impedance values with frequency, and the zero offset of calculated impedance values applied against frequency. Preferably the additional series resistance of this model may be defined by the resistance of the battery, determined through a measurement of the terminal voltage and current exhibited when a direct current signal is applied to the battery.

In a further embodiment the accuracy of the simulation model run by the processor may be improved by substituting the above-referenced single constant phase element fractional capacitor for an equivalent set of fractionally arranged constant phase element fractional capacitor components. In such embodiments the characteristics determined for the above referenced single CPE component may be substituted into a replacement split assembly which defines 'n' smaller CPE components, each of which has the same phase but an 'n' times lower admittance characteristic. This equivalent split assembly may be used to replace a single CPE component with n smaller CPE components, CPE/n, connected in parallel with an intervening resistance Rx/n.

The present invention may provide many potential advantages over the prior art.

In various embodiments the present invention can provide improvements in the assessment of the performance of batteries through utilising at set of measurements captured over a single continuous time period. Existing technology may be used in the implementation of the method of the invention to capture these measurements and to calculate a performance indicator.

Furthermore in some embodiments existing battery charging and discharging infrastructure may be utilised to stimulate the battery with a test current or currents at appropriate frequencies from which the invention can derive such performance information.

In various embodiments the invention may facilitate a method of assessment which may not require a battery to be disconnected from its normal load environment.

In yet further embodiments, the measurements made have improved sensitivity to small changes. This sensitivity can be utilised to provide more accurate performance metrics of the battery being measured. The increased sensitivity of the measurements obtained over time should enable someone skilled in the art to obtain a more reliable prediction of battery failure within a given time window of monitoring.

While performance is one metric by which state of health is measured, quality may also be a valuable metric that could be measured using the present invention. The measurements taken can provide an indication of the true efficiency of the return power and power density of a battery in operation. Accordingly, along with other performance metrics such as fractional capacitance, someone skilled in the art could utilise this method to determine the quality of a battery.

BRIEF DESCRIPTION OF THE DRAWINGS

Additional and further aspects of the present invention will be apparent to the reader from the following description of embodiments, given in by way of example only, with reference to the accompanying drawings in which.

Further aspects of the invention will become apparent from the following description of the invention which is given by way of example only of particular embodiments.

BEST MODES FOR CARRYING OUT THE INVENTION

Figure 1A:
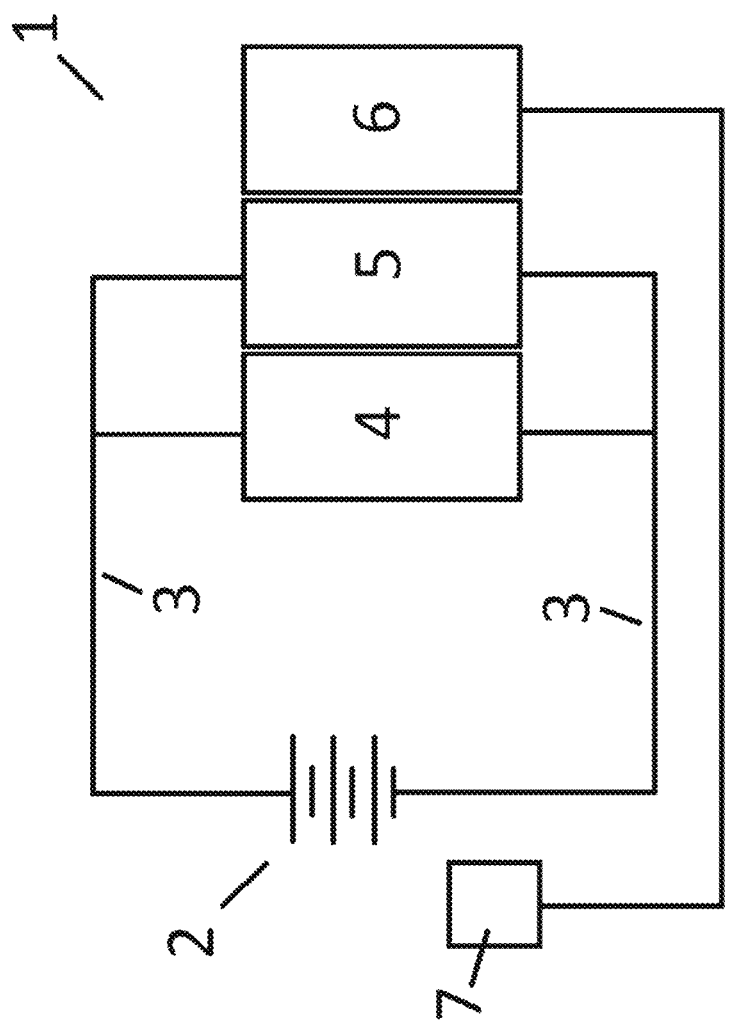
FIG. 1a shows a schematic circuit diagram of a battery performance assessment apparatus as provided in accordance with one embodiment of the invention.

FIG. 1a shows a schematic circuit diagram of a battery performance assessment apparatus 1 as provided in accordance with one embodiment of the invention. The apparatus 1 is connected to a battery 2 by a pair of terminal connectors 3. These terminal connectors provide positive and negative terminal connections to a test current source 4 and a response measurement system 5.

The test current source 4 is configured to supply a set of alternating test currents to the battery, where each of these test currents have a frequency less than an impedance transition frequency, as discussed in more detail with respect to FIG. 3. Each of these alternating test currents is supplied to the battery over several cycles of the frequency selected for the current and current magnitudes are fixed to prevent overcharging or over discharging of the battery.

The response measurement system 5 is configured to measure the terminal voltage and current of the battery when supplied a test current Each of the test current source and response measurement systems are connected to and housed in combination with a processor 6. The processor 6 controls the operation of the test current source 4 and receives voltage and current measurements from the response measurement system 5. The processor 6 is also connected to a temperature sensor 7 which is located close to the battery 2 and is used to provide an indication of the temperature of the battery.

The processor is configured to output a state of health assessment indicator for the battery by calculating at least one impedance for the battery using the received terminal voltage and current measurements. The steps undertaken in this process are discussed in more detail with respect to the flowchart of FIG. 4a.

Figure 1B:
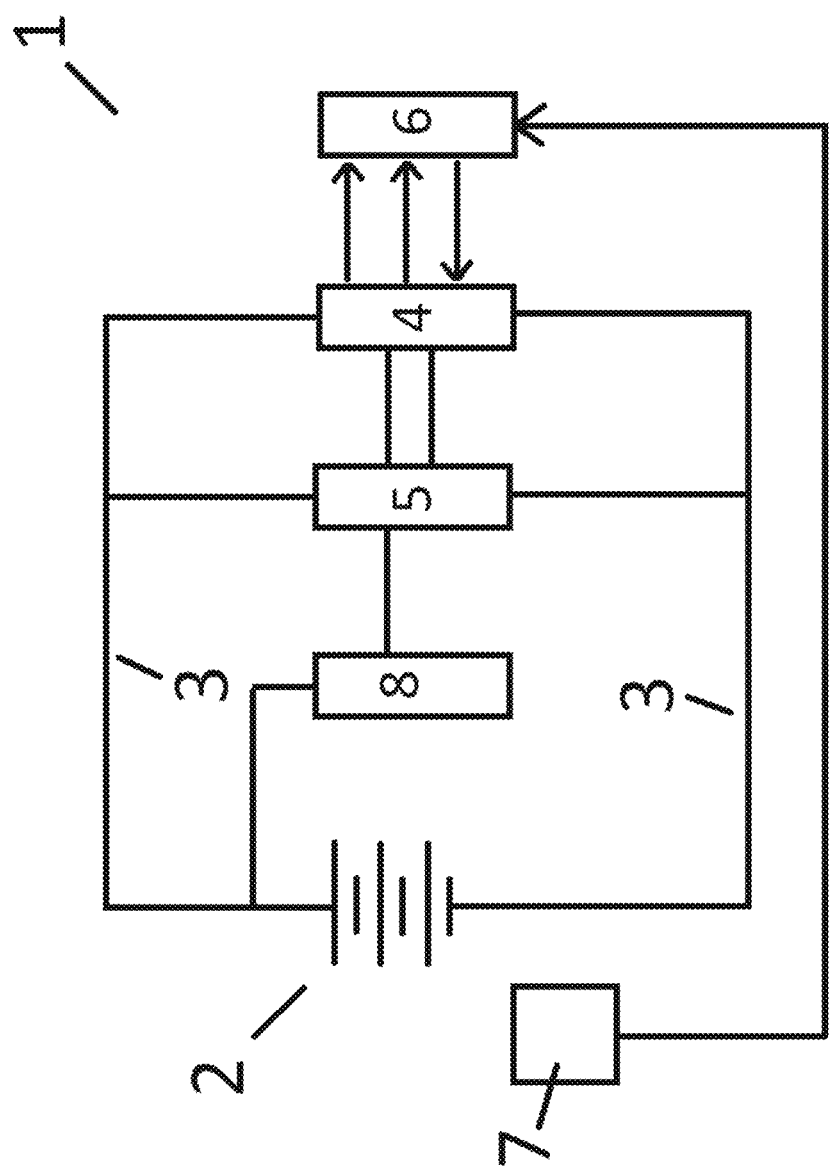
FIG. 1b shows a further schematic circuit diagram of a battery performance assessment apparatus as provided in accordance with another embodiment of the invention.

FIG. 1b shows a further schematic circuit diagram of a battery performance assessment apparatus as provided in accordance with another embodiment of the invention. This circuit is similar in many respects to that shown with respect to FIG. 1a and also incorporates terminal connectors 3 engaged with a battery 2 in addition to a test current source 4.

In the embodiment shown a voltage measurement circuit 5 is connected across the terminals 3 in addition to being connected through to a current measurement circuit 8. A processor 6 is provided with input and output connections to these components, as illustrated by the communications arrows shown. The processor can issue operational commands to the current source 4, while receiving current and voltage measurements from the voltage and current measurement circuits 5, 8—as well as temperature measurements from a temperature sensor 7.

Figure 2:
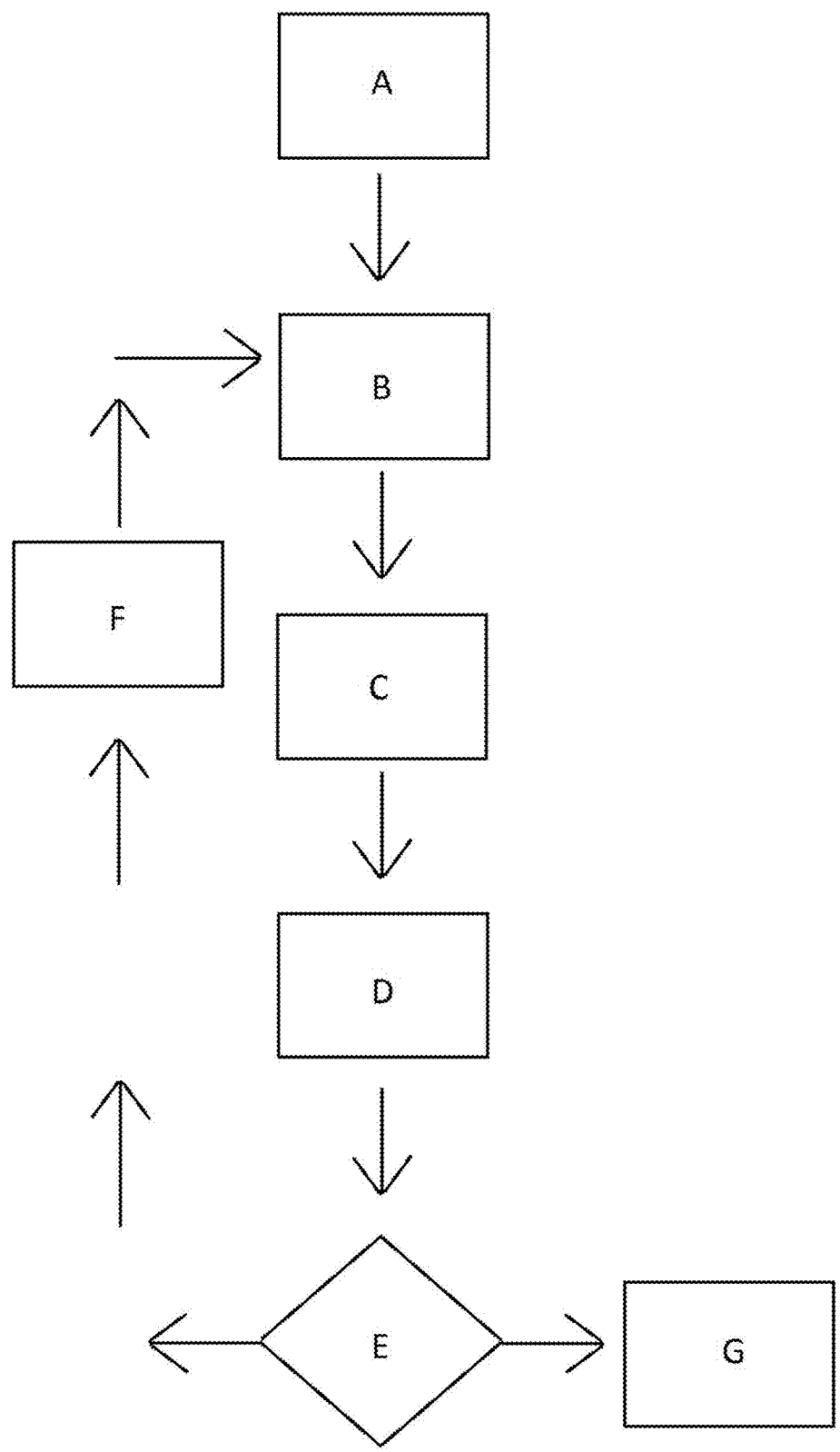
FIG. 2 shows a flowchart of operational steps executed by the assessment apparatus illustrated with respect to FIGS. 1a and 1b.

FIG. 2 shows a flowchart of operational steps executed by the assessment apparatus illustrated with respect to both FIGS. 1a and 1b.

In the embodiment shown the first step A of this method is implemented by an activation command being received from a user.

At step B the temperature sensor connected to the housing of a battery being assessed is polled and temperature information received in reply is sent to the processor memory.

At step C the processor commands the current source to apply the first of a series of alternating test currents to the battery, each current having a specific frequency and peak current amplitude. The processor also controls the time period each test current is applied over.

At step D the response measurement system is used to record a series of battery terminal voltage and current measurements while this test current is being applied. This set of measurements is sent to the processor memory.

At step E a test is applied to determine if the test current which was just used is the last in the series of test currents to be applied to the battery. If this is not true step F is executed to increment through a list of alternating test currents and to read from the processor memory the particulars of the next test current to be applied at step C.

If the recently applied test current is the last in the sequence of test currents step G is executed where the processor calculates a state of health indicator, as discussed in more detail with respect to FIG. 4.

Figure 3A:
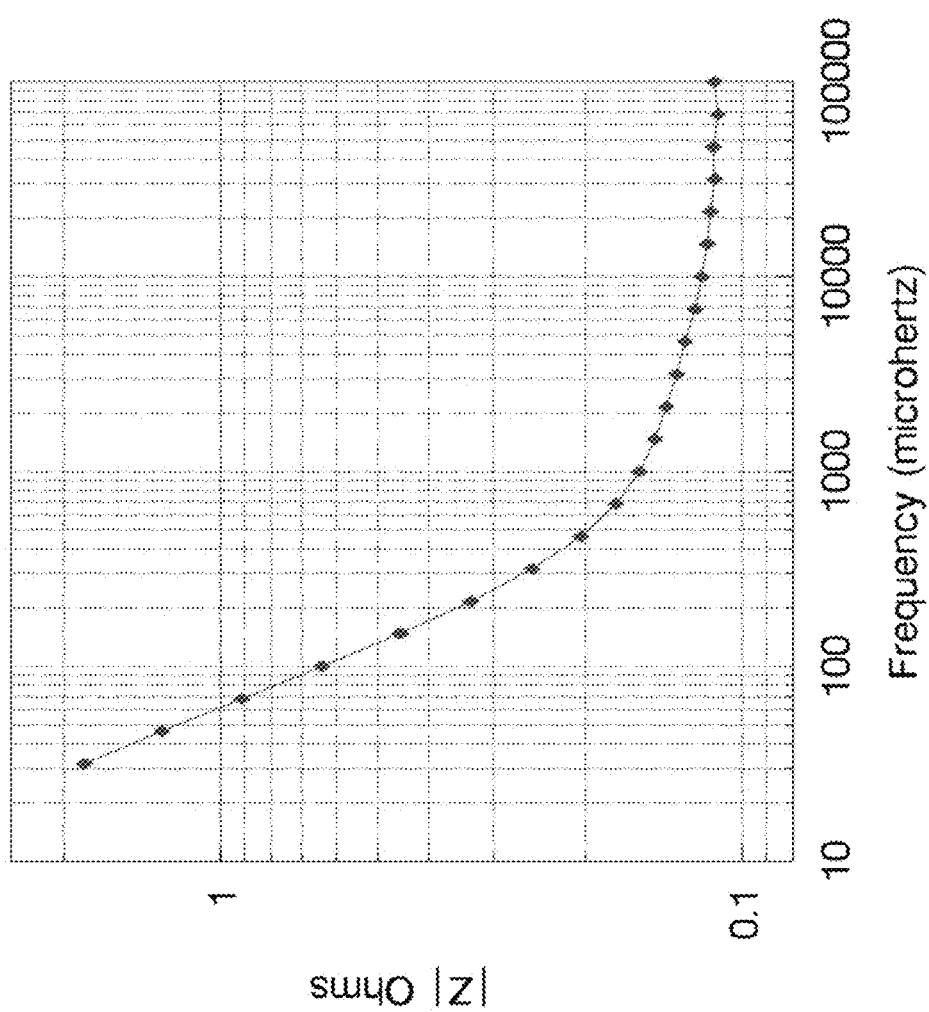
FIG. 3a shows a plot of impedance against frequency for a generic battery and the identification of at least one impedance transition frequency for this battery.

FIG. 3a shows a plot of impedance against frequency for a generic battery and the identification of at least one impedance transition frequency for this battery.

As can be seen from FIG. 3a the rate of change of the battery impedance drops substantially from low frequencies to high frequencies. This behavioural change occurs in the transitional zone centred around $10^{-3}$ Hz. The form of plot shown with respect to FIG. 3 can be used to identify a band of frequencies which define this transitional zone so the invention can supply lower frequency alternating test currents.

Figure 3B:
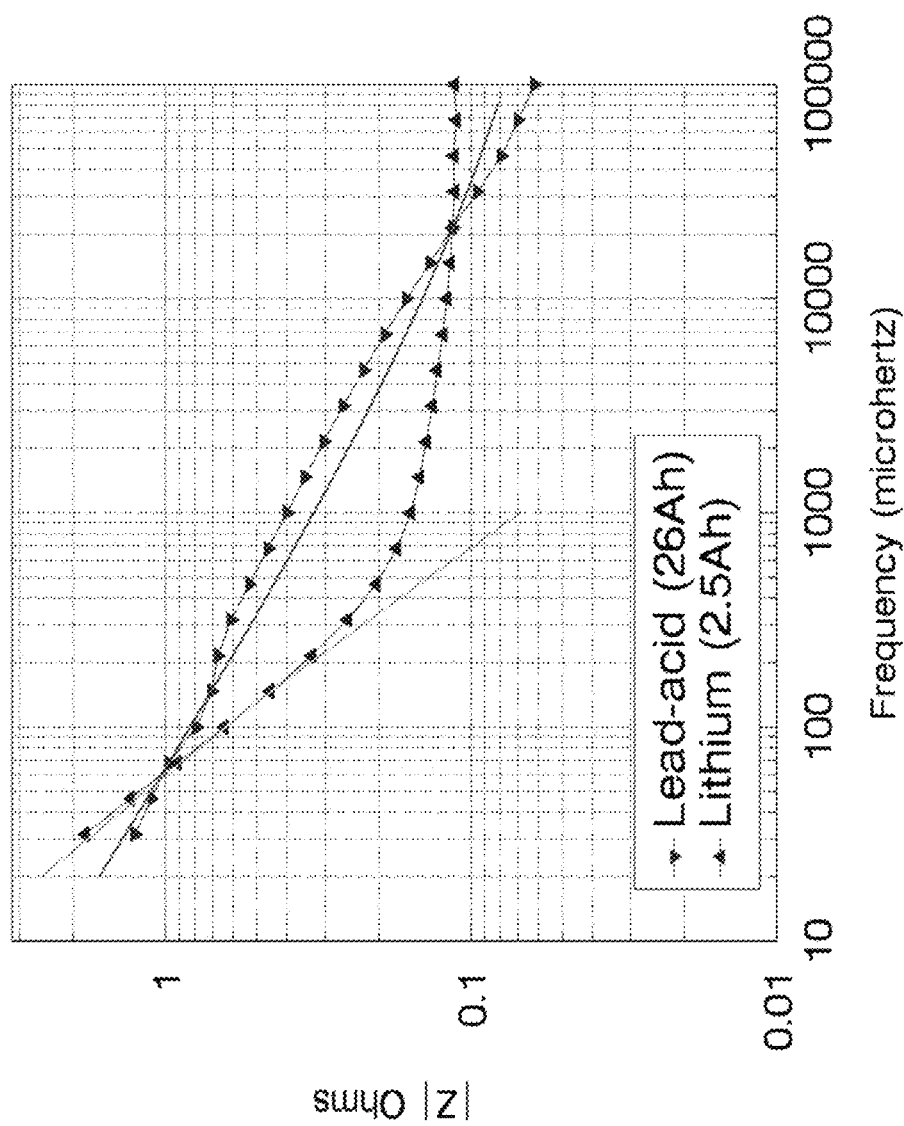
FIG. 3b shows a plot of impedance against frequency for both a Lithium-ion battery (triangle symbol) and a Lead-acid battery (inverted triangle symbol)

FIG. 3b shows a plot of impedance against frequency for both a Lithium-ion battery (indicated by the triangle symbol) and a Lead-acid battery (indicated by the inverted triangle symbol).

As can be seen from FIG. 3b different types of battery will show different transition frequency characteristics and the transition points may shift dependent on battery type, size and quality.

FIG. 3b also highlights the slope of the curve below the transition frequency. The slope indicates loss in a battery, with a smaller slope being associated with lower efficiency of returned power and lower power density. It could therefore be inferred from FIG. 3b that the Lead-acid battery featured therein is of a lesser quality than that the Lithium-ion battery shown.

Figure 3C:
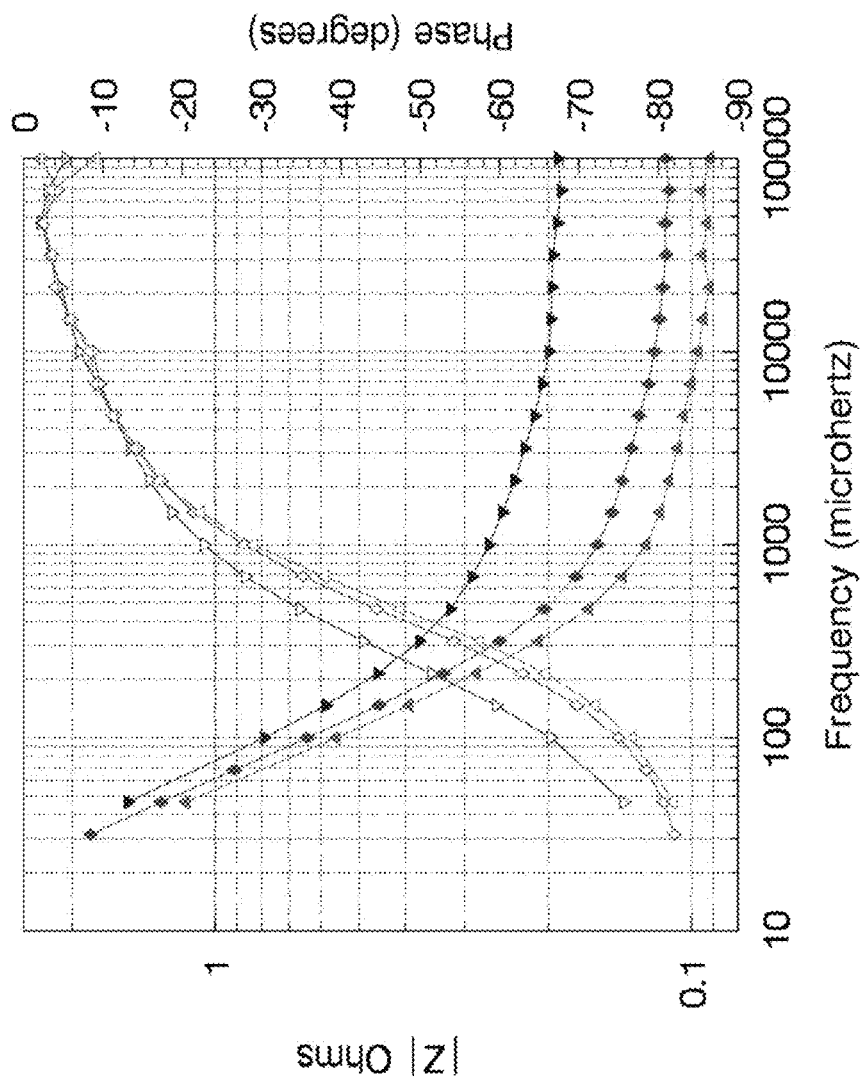
FIG. 3c shows a plot of impedance against frequency and phase for a generic battery where the temperature has been varied (indicated by solid symbols)

FIG. 3c shows a plot of impedance against frequency and phase for a generic battery where the temperature has been varied. As can be seen from FIG. 3c, a change in temperature results in a shift in the slope, which is constant with the understanding that battery performance can be dependent on temperature.

Figure 4A:
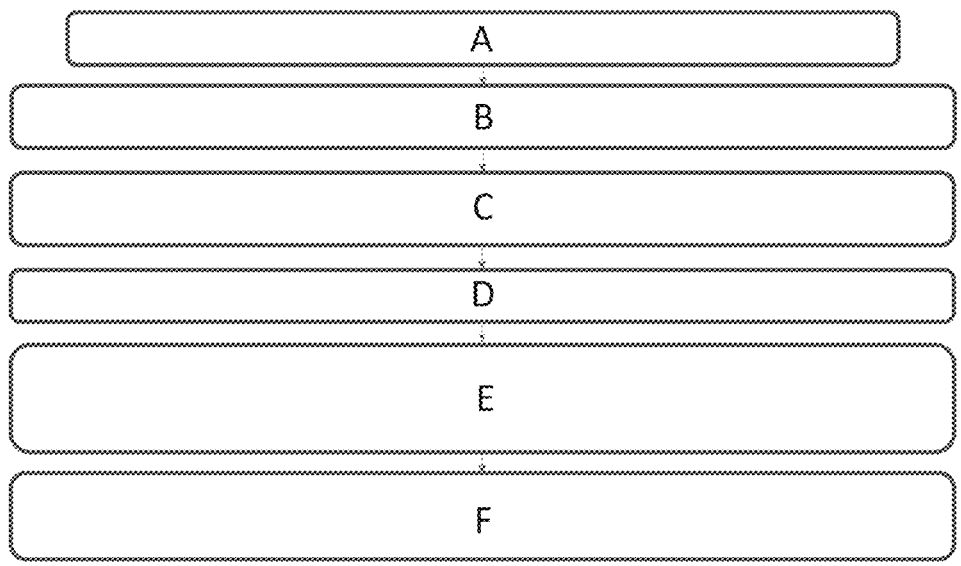
FIG. 4a shows a flowchart of calculation steps performed by the processor shown with respect to FIG. 1a to determine a state of health-based performance assessment indicator.

FIG. 4a shows a flowchart of calculation steps performed by the processor shown with respect to FIG. 1a to determine a state of health based performance assessment indicator.

The first step A of this method a set of current and voltage measurements are loaded into the processor memory.

Next at step B a pre-processing operation is undertaken to improve the accuracy of the results obtained by the processor. The voltage and current data is subjected to a windowing pre-processing algorithm and is filtered to have a linear ramp component removed at this step.

Next at step C a computation is completed to compute magnitude and phase of the voltage and the current at selected test current frequencies. In the embodiment shown a discrete Fourier transform is applied to the data to resolve this information.

At step D a computation is executed to compute the complex impedance Z for particular frequencies of test currents by dividing voltage values by current values.

At step E the processor instantiates a circuit simulation model for the battery by defining the parameters of a sequence of fractionally arranged constant phase elements.

At step F the circuit simulation model generated is used to make a comparison to a maximum charge storage capacity target to indicate the state of health of the battery being assessed. At this stage a comparison is also made with stored state of health indications generated at prior times to identify any trends in the state of health of the battery.

Figure 4B:
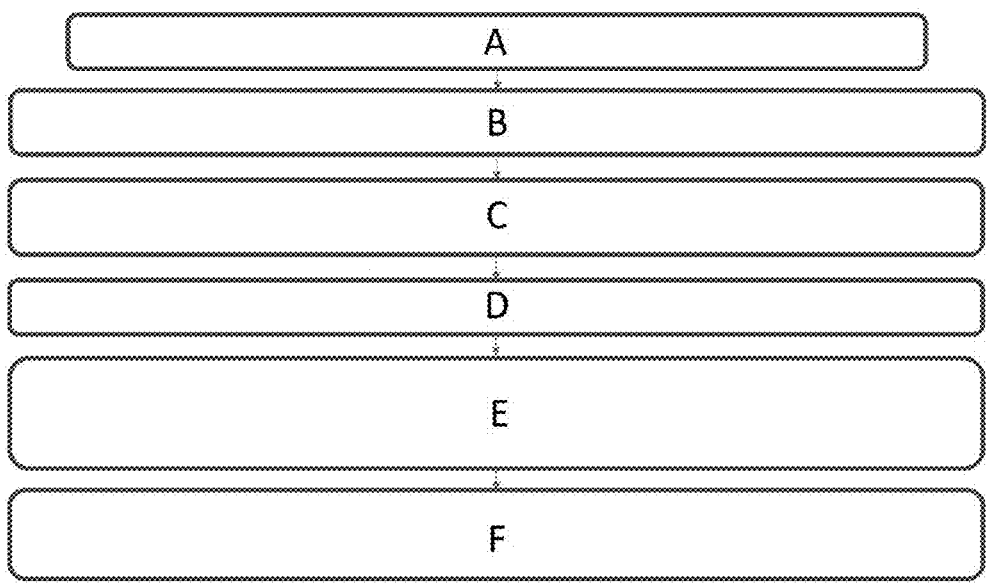
FIG. 4b shows a flowchart of calculation steps performed by the processor shown with respect to FIG. 1b to determine a state of health-based performance assessment indicator.

FIG. 4b shows a flowchart of calculation steps performed by the processor shown with respect to figure 1ab to determine a state of health based performance assessment indicator.

In the embodiment shown steps A, B, C and D are the same as discussed above with respect to FIG. 4a, with voltage and current measurements being loaded to memory, undergoing a pre-processing operation, and voltage and current magnitude and phase being computed at selected test current frequencies. Step D is an executed to compute the complex impedance Z for particular frequencies of test currents by dividing voltage values by current values.

At step E computed values of impedance associated with different frequencies of test currents are applied as cross-referencing parameters to a lookup table loaded to processor memory. The stored entries of this table are pre-calculated to provide a numerical metric indication of battery state of health using previously prepared calibration data for the specific type of battery being assessed. Therefore in this embodiment a circuit simulation model does not need to be instantiated and run by a processor at this stage.

At step F the identified table entry isolated by the input impedance and frequency values is retrieved and displayed to a user to indicate the state of health performance of the battery. Again at this stage a comparison is also made of stored state of health indications generated at prior times to identify any trends in the state of health battery.

Figure 5A:
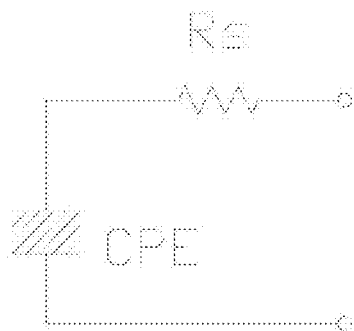
FIGS. 5a and 5b show exemplary representations of equivalent circuit models used in a circuit simulation model implemented in a further aspect of the invention, and FIG. 6 provides an indicative comparative plot of current against time for different frequencies of test current provided in accordance with another aspect of the invention, and FIG. 7 provides an indicative plot of impedance against frequency as used to identify a transition frequency value in various embodiments, and FIG. 8 provides an indicative plot of impedance against frequency comparing measurements from two different batteries exhibiting different zero offset values.
Figure 5B:
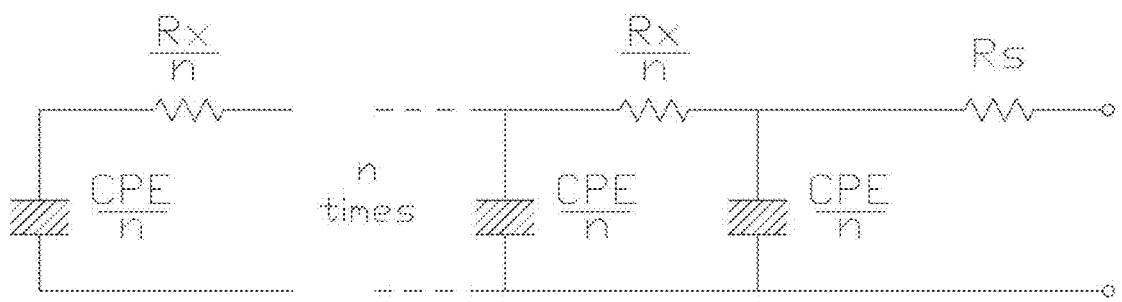

FIGS. 5a and 5b show exemplary representations of equivalent circuit models used in a circuit simulation model implemented in a further aspect of the invention.

In various embodiments the processor can be used to calculate a series of impedance values for the battery, each of these impedances being associated with a particular frequency of alternating test current. These impedances can then be used as input parameters to define each of the components shown in these two equivalent circuit models.

FIG. 5a illustrates an equivalent circuit model for a battery which is composed from a single CPE constant phase element provided in combination with a single series resistance Rs.

The parameters of the CPE component are defined using the rate of change of calculated impedance values with frequency, and the zero offset of calculated impedance values applied against frequency. The additional series resistance Rs is defined by a measurement of the terminal voltage and current exhibited when a direct current signal is applied to the battery.

FIG. 5b shows an alternative circuit model where the single CPE component of FIG. 5b is substituted for an equivalent set of n fractionally arranged constant phase element fractional capacitor components—CPE/n. This equivalent split assembly replaces the single CPE component with n smaller CPE components, CPE/n, connected in parallel with an intervening resistance Rx/n to the same series resistance as before, Rs.

Figure 6:
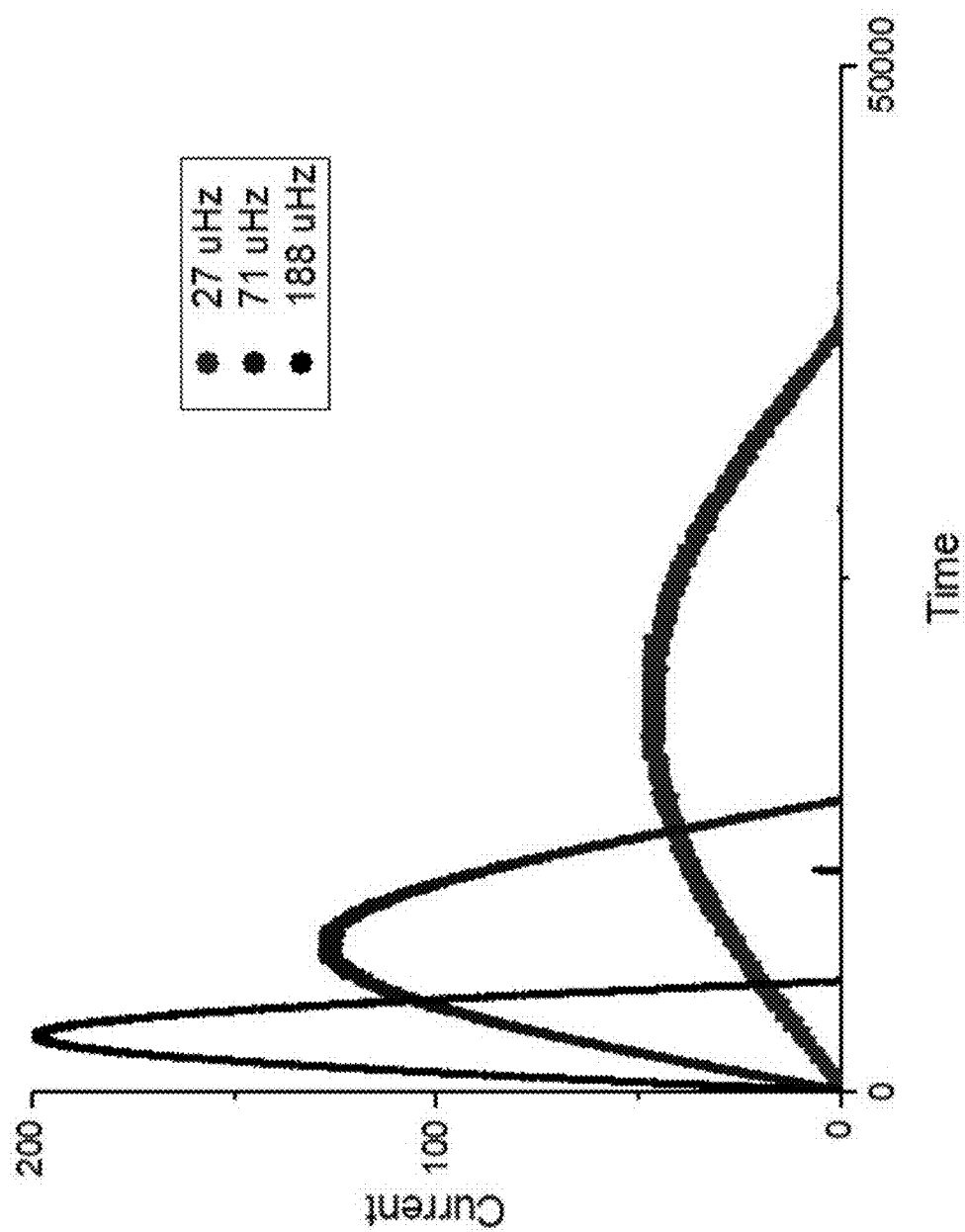

FIG. 6 provides an indicative comparative plot of current against time for different frequencies of test current provided in accordance with another aspect of the invention.

In the embodiment shown the processor is configured to control the amplitude and frequency of the alternating test current applied to a battery. These controls are applied to avoid overcharging the battery during a measurement period as test currents are supplied to the battery.

As can be seen from FIG. 6 the amplitude of an alternating test current is set based on the frequency of the signal being applied and the capacity of the battery being assessed. The 188 µHz test current has the shortest wavelength shown, so is allowed to exhibit the highest current peak. Comparatively the 71 and 27 µHz test currents have increasingly longer wavelengths and need to be applied for longer times, so the current peak of each is progressively limited by the operation of the processor. In this way the test currents applied can deliver or remove approximately 10 percent or less of the charge capacity of the battery.

Figure 7:
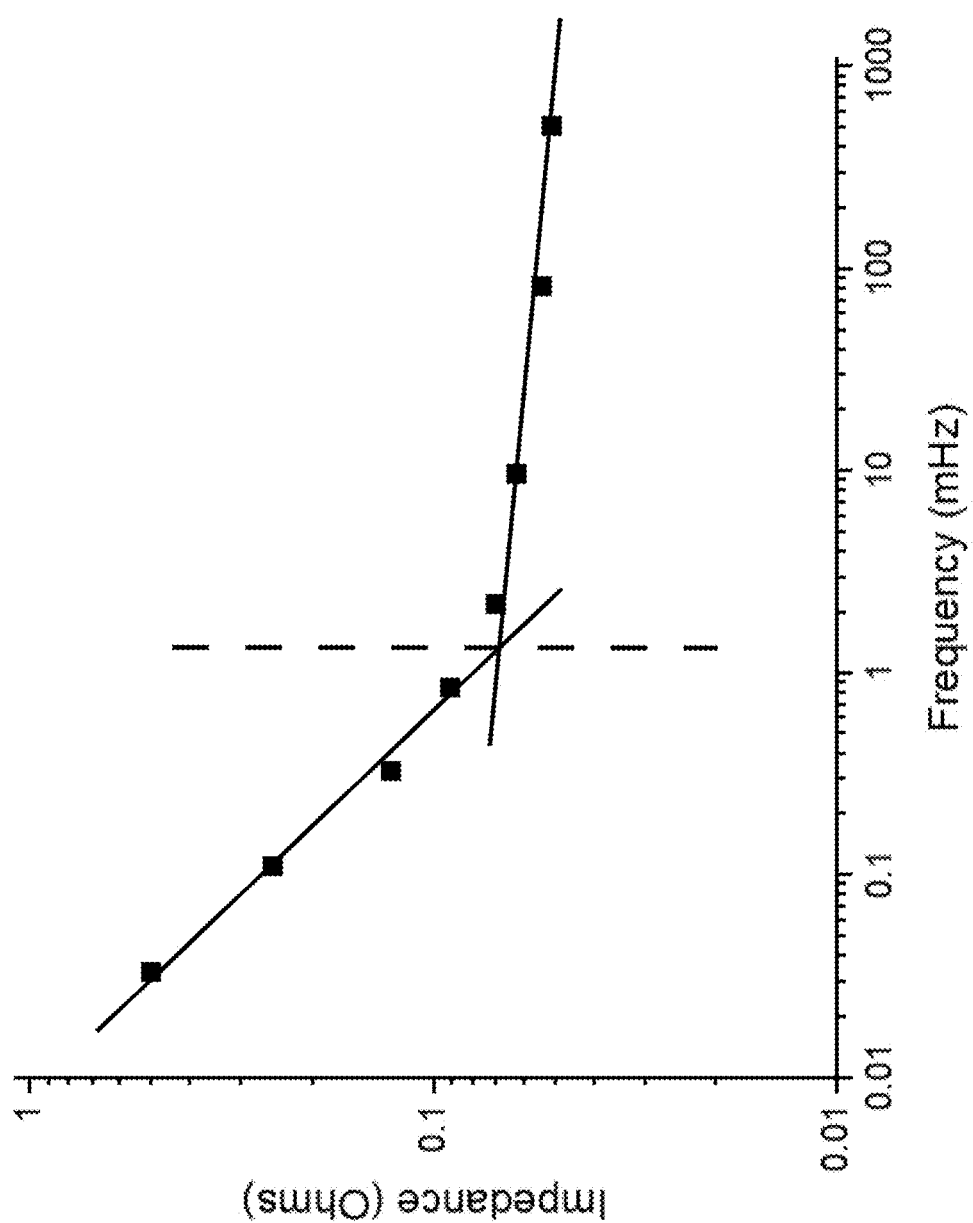

FIG. 7 provides an indicative plot of impedance against frequency as used to identify a transition frequency value in various embodiments. In such embodiments a performance assessment indicator may be calculated using the lower-frequency impedance values plotted with frequency coupled to the high-frequency impedance values. As shown by FIG. 7 the values of impedance recorded using test currents below the impedance transition frequency suggest a straight line. Where this straight line crosses the value measured at high frequencies is an estimate of the impedance transition frequency. This value is identified in FIG. 7 at the frequency where the two fitted lines intersect. In various embodiments a relatively high impedance transition frequency can indicate that a battery has a reduced ability to sustain high power energy delivery.

Figure 8:
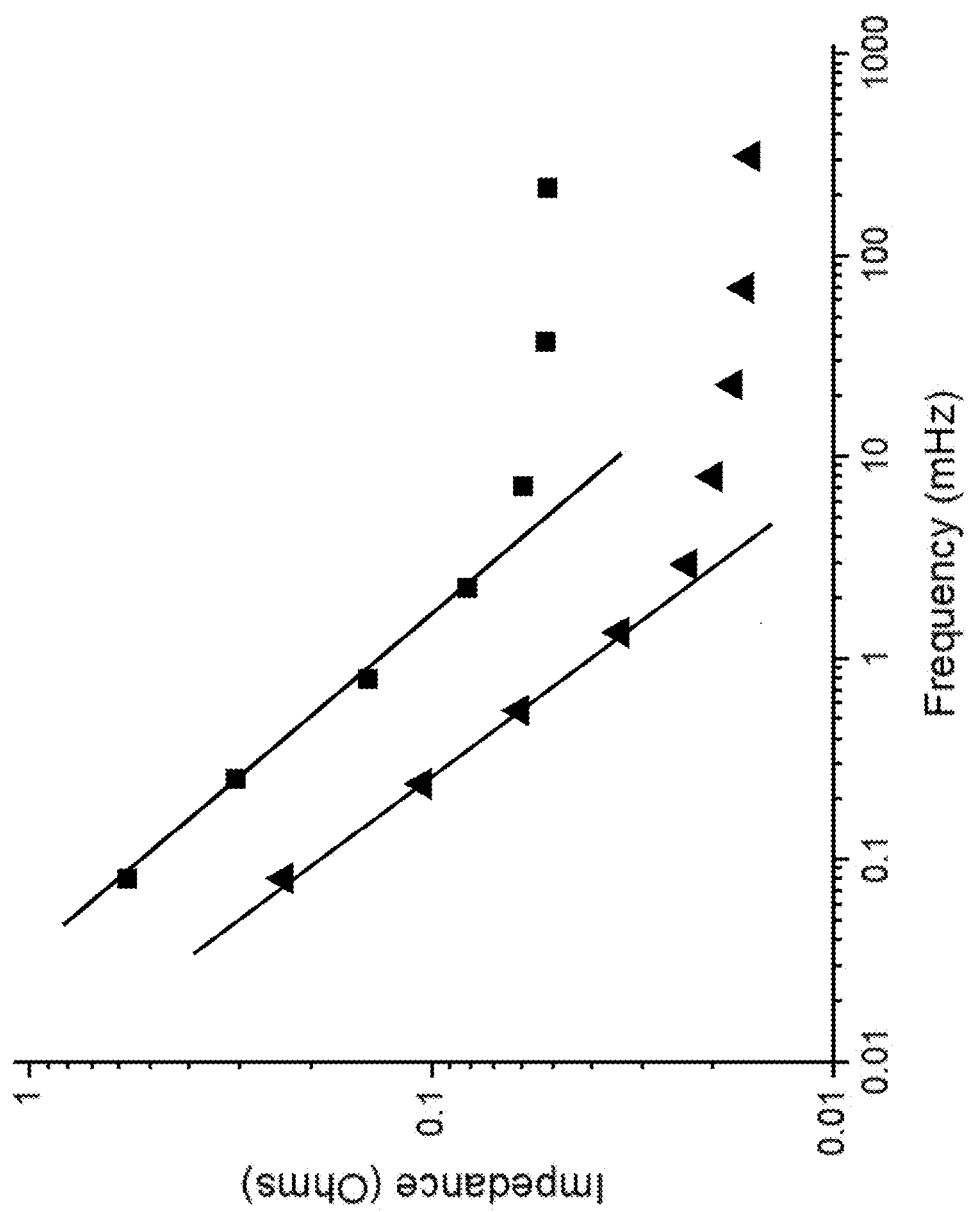

FIG. 8 provides an indicative plot of impedance against frequency comparing measurements from two different batteries exhibiting different zero offset values.

In such embodiments a performance assessment indicator representative of the maximum charge capacity of the battery may be evaluated by, for example, extrapolating a y-axis intercept value for plotted impedance measurements against test current frequency, or alternatively comparing impedance values at a selected predetermined frequency value below the impedance transition frequency.

As can be seen from FIG. 8 the lower triangle data point plot has an anticipated lower y-axis intercept when compared with the anticipated y-axis intercept of the upper square data point plot. Similarly the low frequency impedance measurements of the triangle data point plot all exhibit small zero offset values when compared with the square data point plot. This indicates that the battery associated with the triangle data point measurements has a greater storage capacity when compared with the battery associated with the square data point measurements.

In the preceding description and the following claims the word "comprise" or equivalent variations thereof is used in an inclusive sense to specify the presence of the stated feature or features. This term does not preclude the presence or addition of further features in various embodiments.

It is to be understood that the present invention is not limited to the embodiments described herein and further and additional embodiments within the spirit and scope of the invention will be apparent to the skilled reader from the examples illustrated with reference to the drawings. In particular, the invention may reside in any combination of features described herein, or may reside in alternative embodiments or combinations of these features with known equivalents to given features. Modifications and variations of the example embodiments of the invention discussed above will be apparent to those skilled in the art and may be made without departure of the scope of the invention as defined in the appended claims.

What we claim is:

1. A battery performance assessment apparatus which includes
    two terminal connectors configured to electrically connect the assessment apparatus to the positive and negative terminals of a battery being assessed, and
    a response measurement system configured to measure the terminal voltage and current of the battery when supplied with at least one alternating test current having a frequency less than 1 Hz and/or less than an impedance transition frequency associated with the battery being assessed, and
    a processor in communication with the response measurement system and being configured to output a performance assessment indicator for the battery being assessed by calculating at least one impedance for the battery using terminal voltage and current measurements communicated by the response measurement system, wherein the processor is configured to control the amplitude and frequency of the alternating test current applied to a battery and the amplitude of the alternating test current is set based on the frequency of the alternating test current and the capacity of the battery being assessed.

2. The battery performance assessment apparatus as claimed in claim 1 which includes a test current source configured to supply at least one alternating test current to the battery being assessed, said at least one alternating test current having a frequency less than 1 Hz and/or less than an impedance transition frequency associated with the battery being assessed.

3. The battery performance assessment apparatus as claimed in claim 2 wherein the test current source is provided by a dedicated alternating current generation circuit.

4. The battery performance assessment apparatus as claimed in claim 2 wherein the test current source incorporates switching electronics connected across two or more batteries.

5. The battery performance assessment apparatus as claimed in claim 1 wherein the test current source is provided by regular load and charging circuits.

6. The battery performance assessment apparatus as claimed in claim 1 wherein the processor is programmed to implement a circuit simulation model which uses the terminal voltage and current measurements communicated to the processor as input parameters to define at least one constant phase element fractional capacitor to simulate the battery being assessed.

7. The battery performance assessment apparatus as claimed in claim 1 wherein the processor is programmed to implement a circuit simulation model which uses the terminal voltage and current measurements communicated to the processor as input parameters to define a plurality of fractionally arranged constant phase element fractional capacitor components to simulate the battery being assessed.

8. The battery performance assessment apparatus as claimed in claim 1 wherein a performance assessment indicator is determined using voltage and current measurements recorded during a single measurement period in response to several different frequencies of test currents.

9. The battery performance assessment apparatus as claimed in claim 1 wherein a performance assessment indicator is determined using multiple voltage and current measurements recorded during different measurement periods in response to the same test current.

10. The battery performance assessment apparatus as claimed in claim 1 wherein the test current source applies a composite test current signal formed from the summation of two or more alternating test currents with different frequencies.

11. The battery performance assessment apparatus as claimed in claim 1 wherein a performance assessment indicator is calculated using the rate of change of calculated impedance values with frequency.

12. The battery performance assessment apparatus as claimed in claim 1 wherein a performance assessment indicator is calculated using the transition frequency value.

13. The battery performance assessment as claimed in claim 1 wherein a performance assessment indicator is calculated using at least one impedance zero offset value.

14. The battery performance assessment apparatus as claimed in claim 1 wherein a performance assessment indicator is calculated using a transition bandwidth value.

15. The battery performance assessment apparatus as claimed in claim 1 wherein the assessment apparatus applies a test current for at least one cycle of the frequency of the test current.

16. The battery performance assessment apparatus as claimed in claim 1 which includes a temperature sensor placed in close proximity to the battery being assessed.

17. The battery performance assessment apparatus as claimed in claim 1 wherein at least one component of the processor is located remotely from the terminal connectors and response measurement system.

18. The battery performance assessment apparatus as claimed in claim 1 wherein the test current applied delivers or removes approximately 10 percent or less of the charge capacity of the battery.

19. The battery performance assessment apparatus as claimed in claim 1 wherein the processor is configured to execute a preliminary charge state fixing process prior to applying an alternating test current to a battery.

* * * * *